United States Patent [19]

Landsberg et al.

[11] Patent Number: 5,196,982
[45] Date of Patent: Mar. 23, 1993

[54] ELECTRICAL POWER MONITORING SYSTEM

[75] Inventors: Dennis Landsberg, Syracuse; Bradley J. Hesse, Dewitt, both of N.Y.

[73] Assignee: The Fleming Group, Syracuse, N.Y.

[21] Appl. No.: 749,374

[22] Filed: Aug. 23, 1991

[51] Int. Cl.$^5$ .................................. H02H 3/08
[52] U.S. Cl. ................................. 361/93; 361/78
[58] Field of Search .................. 361/93, 82, 68, 78; 364/483, 480, 492; 324/103

[56] References Cited

U.S. PATENT DOCUMENTS

| | | | |
|---|---|---|---|
| 2,654,068 | 9/1953 | Mertens | 324/103 |
| 4,335,437 | 6/1982 | Wilson | 361/82 |
| 4,476,535 | 10/1984 | Loshing et al. | 364/480 |
| 4,819,180 | 4/1989 | Hedman et al. | 364/483 |
| 4,858,141 | 8/1989 | Hart et al. | 364/483 |

*Primary Examiner*—A. D. Pellinen
*Assistant Examiner*—S. Jackson
*Attorney, Agent, or Firm*—Salzman & Levy

[57] ABSTRACT

A method and system incorporating an integral power consumption monitor-circuit breaker panel for industrial or commercial buildings and facilities. The power consumption monitor-circuit breaker panel not only protects each end use within the building against harmful overloads, but also monitors peak power demands of each end use. Electrical current, voltage and phase information is provided by each monitor-breaker. This information is then fed to a processing circuit that provides a power consumption value. The power consumption value is then fed to recording device to provide a power consumption history for each end use. Each monitor-breaker is identified by its end use, as for example, by color coding. The monitor device of each circuit breaker is designed to provide a voltage that is proportional to the circuit load. Two methods may be used to provide such a voltage signal: a) the voltage signal can be developed across a built-in shunt in each circuit braeker; and b) a proportional voltage can be obtained by use of a circuit breaker with a built-in Hall effect device, wherin the product of the instantaneous current and voltage along with the phase angle between them, provides the power measurement. The current and/or instantaneous power information can be sent to the recording device via a powerline carrier, radio link, or optical fiber. The information can be integrated to provide either kW or kW/hr readings.

16 Claims, 5 Drawing Sheets

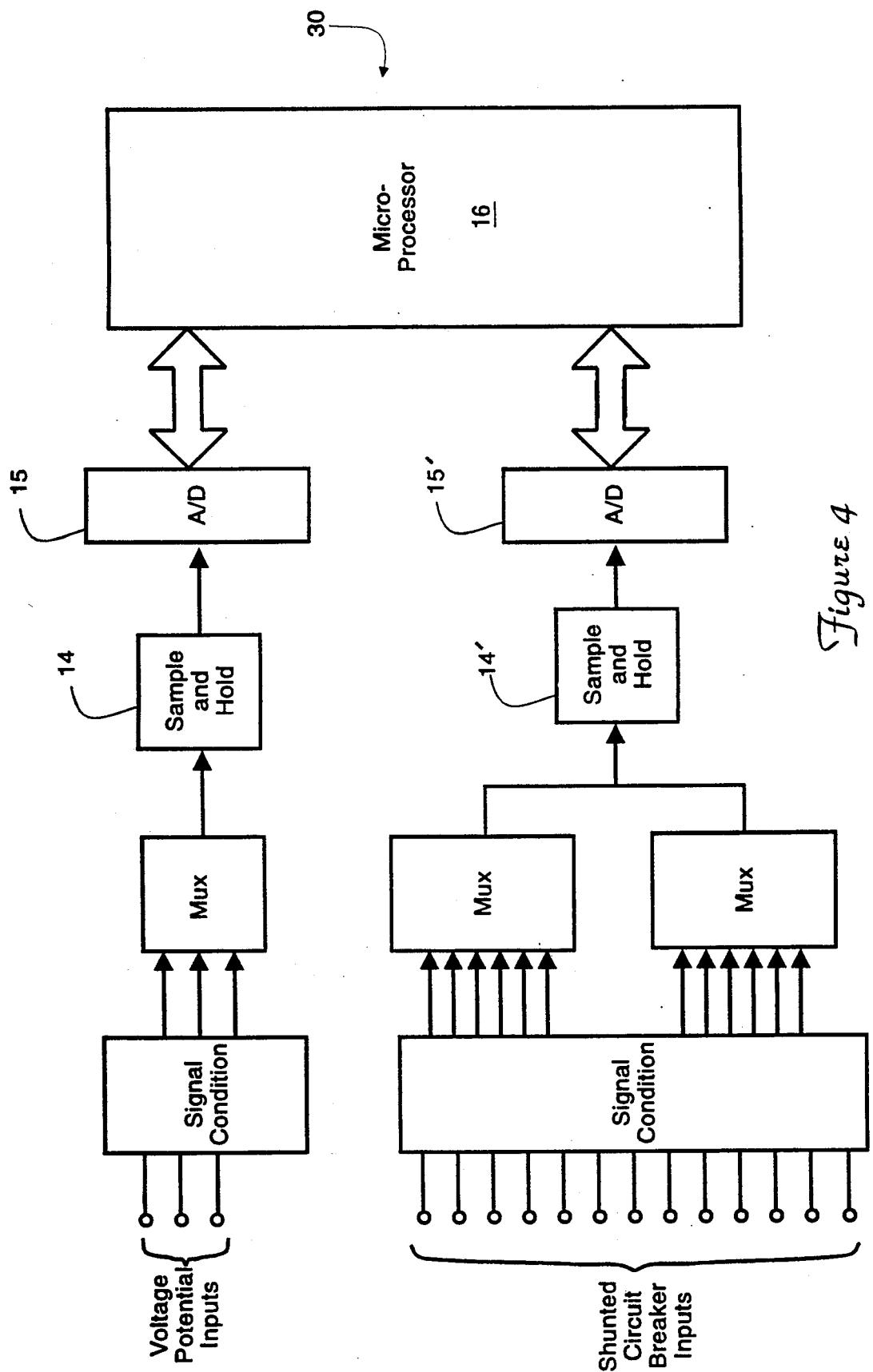

ELECTRICAL POWER MONITORING SYSTEM

FIELD OF THE INVENTION

The invention relates to a method and system for monitoring power consumption in a building or other facility, and more particularly to a power consumption monitor that is non-intrusive and forms an integral part of the circuit breaker panels of an industrial or commercial building.

BACKGROUND OF THE INVENTION

A need presently exists for an inexpensive, non-intrusive means of monitoring power consumption by end use, in an industrial or commercial building. Measurement of peak electrical demand for lighting, heating, cooling and air distribution in a building is useful for both research and billing purposes.

As early as 1953, as disclosed in U.S. Pat. No. 2,654,068 issued to Mertens, entitled "Combined Fuse and Demand Meter," demand (current) meters were disposed in a housed fuse construction, and mounted on the door thereof. Those prior systems, however, provided an indicator only; no provision was made for recording or analyzing data either concurrently or subsequently, nor was an end use application anticipated.

A non-intrusive load monitoring system has been developed for monitoring appliances in private residences, as illustrated and described in U.S. Pat. No. 4,858,141 issued to Hart et al, on Aug. 15, 1989, entitled "Non-intrusive Appliance Monitor Apparatus." The above-mentioned system utilizes harmonics to sense individual devices within a residence from the main meter. This system is generally expensive, despite the fact that it attempts to reduce cost by using sophisticated software in lieu of hardware.

One of the major drawbacks of this prior system is its inability to work effectively with multi-state or variable speed devices, albeit it was never designed to do so. The operational dependence of the aforementioned system upon individual device characteristics makes it impractical for monitoring commercial structures. This is so because commercial buildings have a wider variety of devices, which would require site specific customization. The cost alone of surveying a building for such customization would be prohibitively high. Also, the building industry is currently attempting to eliminate devices that result in disturbances through the electrical system. This would eliminate the ability of the aforesaid system to detect many of the power consuming units.

The present invention seeks to provide an inexpensive, non-intrusive system for monitoring power consumption by end use rather than by identifying a particular device. The invention is incorporated in the circuit breaker panels of commercial buildings, either by retrofit or as original equipment. Of course, economies of installation are achieved by incorporating power measurement into an existing building component (i.e., the circuit breaker), when possible, rather than designing a system having new components which must be interfaced with existing building systems.

The power consumed in any circuit is dedicated to a particular end function, such as lighting or cooling, etc. The measurement of any particular power drain is transmitted to a multiple end use register, where it is summed with similar measurements from other end use sources. Power consumption measurement can be integrated to provide both kW and kW/hr use.

SUMMARY OF THE INVENTION

In accordance with the present invention, there is provided a method and system incorporating an integral power consumption monitor-circuit breaker panel for industrial or commercial buildings and facilities. The power consumption monitor-circuit breaker panel not only protects each end use within the building against harmful overloads, but also monitors peak power demands of each end use. Electrical current, voltage and phase information is provided by each monitor-breaker. This information is then fed to a processing circuit that provides a power consumption value. The power consumption value is then fed to recording device to provide a power consumption history for each end use. Each monitor-breaker is identified by its end use, as for example, by color coding. The monitor device of each circuit breaker is designed to provide a voltage that is proportional to the circuit load. Two methods may be used to provide such a voltage signal: a) the voltage signal can be developed across a built-in shunt in each circuit breaker, as it distributes current to its load, the voltage being both proportional to, and in phase with, the current drawn by the load; and b) a proportional voltage can be obtained by use of a circuit breaker with a built-in Hall effect device, wherein the product of the instantaneous current and voltage along with the phase angle between them, provides the power measurement. The current and/or instantaneous power information can be sent to the recording device via a powerline carrier, radio link, or optical fiber. The information can be integrated to provide either kW or kW/hr readings.

BRIEF DESCRIPTION OF THE DRAWINGS

A complete understanding of the present invention may be obtained by reference to the accompanying drawings, when considered in conjunction with the subsequent detailed description, in which:

FIG. 4 is a circuit diagram of the power measurement system connected to the circuit breaker panel utilizing the built-in shunt devices of FIGS. 2 and 3;

DESCRIPTION OF THE PREFERRED EMBODIMENT

Generally speaking, the invention pertains to an electrical load monitoring system for industrial or commercial buildings, wherein the monitoring apparatus is integrated with the circuit breaker panel. Each circuit breaker in each panel supplies current for a particular end use, and all the end use power loads are recorded and summed by a peripheral microprocessing unit.

Figure 1:
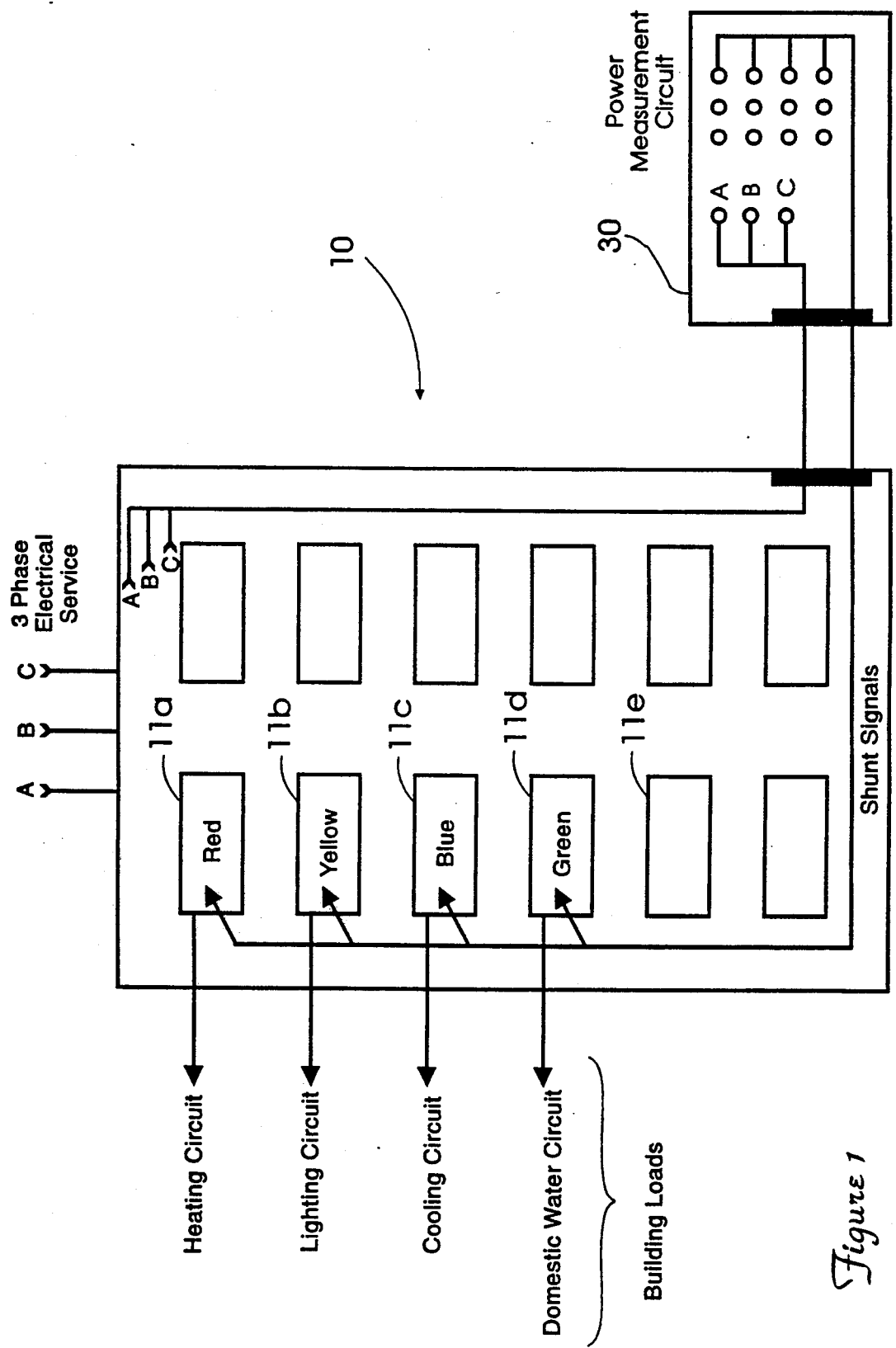
FIG. 1 is a diagrammatic view of a circuit breaker panel configured in accordance with the invention.

Now referring to FIG. 1, a typical circuit breaker panel 10 is shown in accordance with the present invention. The circuit breaker panel 10 comprises a series of circuit breaker switches 11a, 11b, 11c, 11d, 11e, etc., respectively, that have been color coded logically, for the convenience of installers, to reflect their end use. By way of example, circuit breaker switch 11a is color coded red, and is connected to the heating circuit of the building. Circuit breaker switch 11b is color coded yellow, and switches current to the lighting circuit of the building. The various circuit breaker switches 11a, 11b, 11c, etc., connect to different end use circuits supplying particular services within the building. There may be more than one panel 10 for large office buildings, in which case there may be a panel 10 with a lighting circuit switch 11a for each floor. If an entire panel is dedicated to one end use, power measurement need be made only at the main breaker(s) for the panel.

Figure 2:
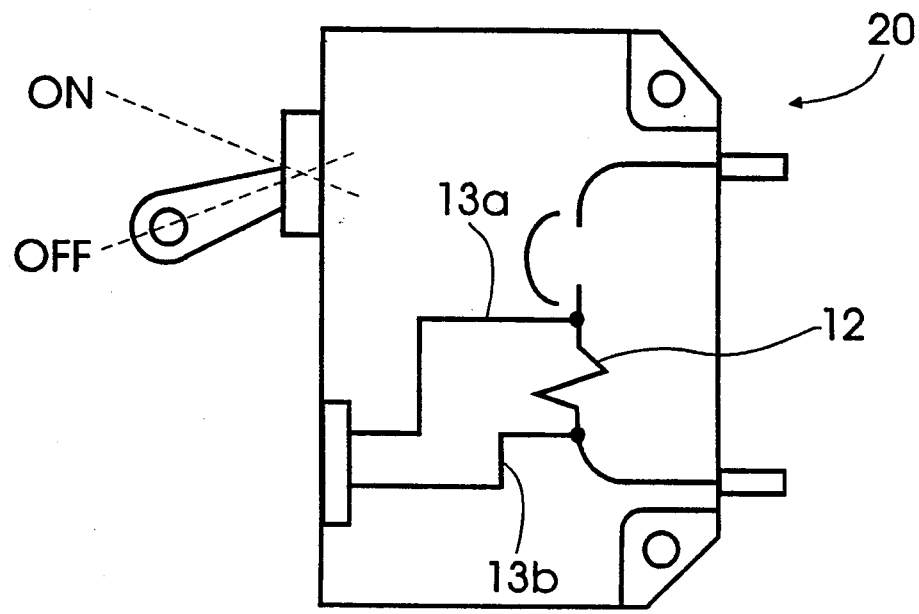
FIG. 2 depicts a schematic view of a typical tab type series trip circuit breaker with a built-in shunt, as utilized in the circuit breaker panel shown in FIG. 1.
Figure 3:
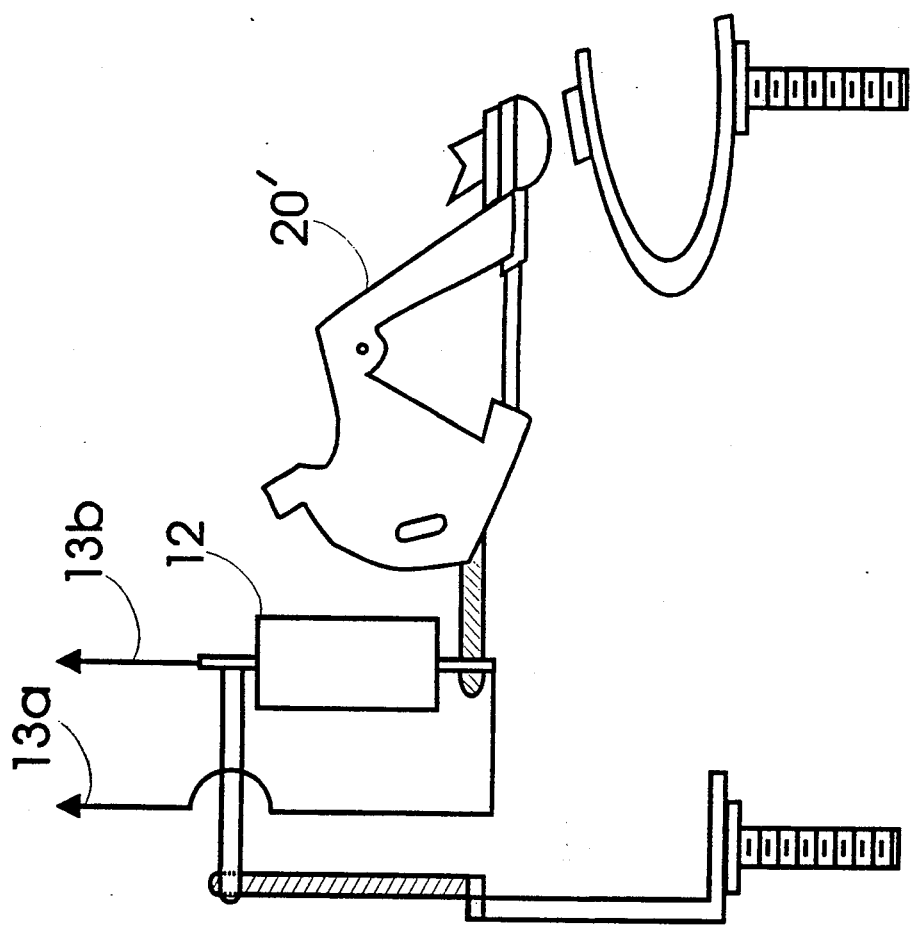
FIG. 3 is a schematic view of an alternate embodiment of a circuit breaker with built-in shunt, as illustrated in FIG. 2.

Each circuit breaker switch 11a, 11b, 11c, etc., respectively, contains a built-in, current shunt device 12, as shown in the two types of circuit breaker 20 and 20', respectively illustrated in FIGS. 2 and 3. Current being drawn through the shunt 12 of either circuit breaker 20 or 20' to feed an end use circuit produces a voltage that is proportional to, and in phase with the current. The shunts 12 are sized to provide a full scale voltage in the approximate range of between 0 and 333 mV. This voltage range can be used in breakers carrying 15 amps or 200 amps. The necessary resistance of each shunt can be calculated by dividing the voltage requirement by the current. For example, the shunt resistance for a 200 ampere circuit will be approximately 0.0222 ohms, while the resistance for a 15 ampere circuit will be approximately 0.00166 ohms.

Each shunted circuit breaker switch 11a, 11b, 11c, etc., has two voltage leads 13a and 13b, respectively. These leads provide a voltage signal proportional to, and in phase with, the current through shunt 12. The leads are connected to a measurement circuit 30, shown in the block diagram adjacent panel 10 of FIG. 1, and in detail in FIG. 4.

The voltage signals from each pair of voltage leads 13a and 13b, respectively, are multiplexed and fed to small aperture, sample and hold circuits 14 connected to a twelve bit analog to digital converter 15. Likewise, the current signal from each circuit breaker is multiplexed and fed to sample and hold circuits 14' connected to digital converter 15'. A microprocessor 16 receives the converted signals, sampling the voltage and current wave up to ten times per line cycle. The microprocessor 16 contains memory for recording the results of each measurement, which is processed into kW or integrated into kW/hr values. All the values for the lighting circuits or for the heating circuits, etc., can be summed to provide a total end use reading.

Other means of obtaining the kilowatt readings are available, as can be observed from the circuitry described in U.S. Pat. Nos. 3,505,508; 3,522,421; 3,789,201; 4,034,233; 4,059,747; 4,075,699; 4,240,030; 4,241,237; and 4,253,151. The power measurements can be conveyed to a recording system via a hard wire link, radio, power line carrier or optical fiber.

Figure 5:
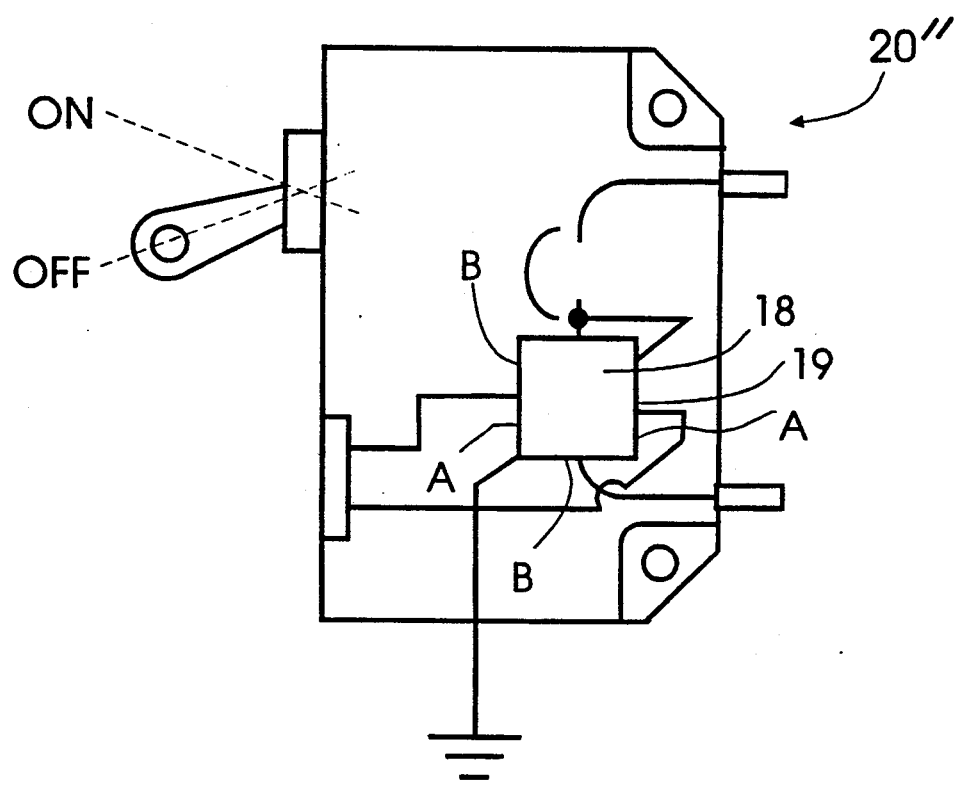
FIG. 5 is a schematic view of a circuit breaker having a built-in Hall effect sensor usable in the circuit breaker panel illustrated in FIG. 1.

Referring to FIG. 5, a circuit breaker 20" featuring a built-in Hall effect sensor 18, is illustrated. The circuit breaker 20" can be utilized in the circuit breaker panel 10 of FIG. 1 in place of the shunted circuit breakers 20 and 20' of FIGS. 2 and 3, respectively.

Figure 6:
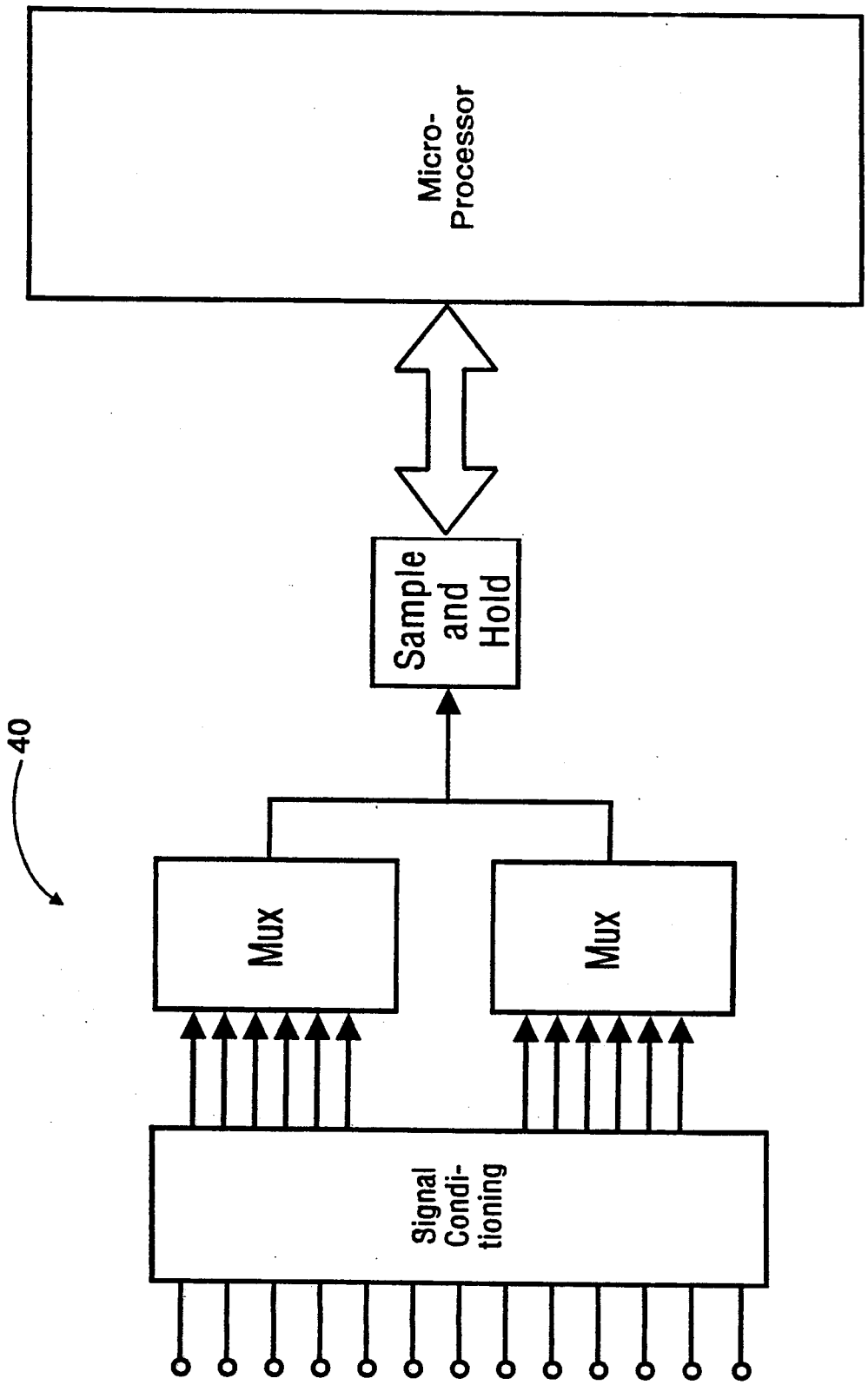
FIG. 6 is a circuit diagram of the measurement system used in conjunction with the built-in Hall effect sensor and circuit breaker of FIG. 5.

The Hall effect sensor 18 and the associated processing circuitry 40 shown in FIG. 6 is housed within the circuit breaker 20'. Hall effect devices such as Model BH-200 series, and FH-300 series, manufactured by F. W. Bell can be employed in the AC watt measurement. Hall sensor 18 supplies a bias voltage directly related to the line voltage source from which the current is flowing to the end use circuitry. The voltages are disposed on opposite plate edges A—A and B—B. The operation of the Hall effect device 18 and its plate output voltage is described in U.S. Pat. No. 2,550,492. Hall effect plate 19 is mounted in the air gap of a current transformer or yoke, through which a current carrying conductor passes. The output signals are fed to a circuit 40, but do not include the voltage potential inputs required for shunt processing circuitry. The voltage signal of Hall effect sensor 18 provides a signal proportional to instantaneous watts. Circuit 40 depicts similar sample and hold, A/D converter, and microprocessor, as that of circuit 30, shown in FIG. 4.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the current invention, what is desired to be protected by Letters Patent is presented by the subsequently appended claims.

What is claimed is:

1. An end use power consumption monitor for industrial or commercial buildings integrally constructed with a circuit breaker, said power consumption monitor disposed in a current carrying line feeding an end use circuit of said industrial or commercial building, said power consumption monitor providing a voltage signal proportional to current being carried by said circuit breaker for said end use circuit, said power consumption monitor operatively connected to a processing circuit for receiving said voltage signal and for processing said voltage signal to provide a power consumption value for said end use circuit, said end use power consumption monitor further including a circuit breaker panel for housing said power consumption monitor integrally constructed with said circuit breaker, and wherein a plurality of power consumption monitors and integral circuit breakers are housed by said circuit breaker panel, each of said plurality of power consumption monitors and integral circuit breakers being operative for a separate end use, and further wherein each end use is coded to identify said end use on said circuit breaker panel.

2. The end use power consumption monitor of claim 1, wherein said power consumption monitor further comprises a shunt disposed in said current carrying line.

3. The end use power consumption monitor of claim 1, wherein said power consumption monitor further comprises a Hall effect sensor disposed in said current carrying line.

4. The end use power consumption monitor of claim 1, wherein said processing circuit comprises a sample and hold circuit for receiving said voltage signal, an A/D converter connected to said sample and hold circuit for converting said voltage signal to a digital value, and a microprocessor connected to said A/D converter for processing said digital value to provide a power consumption value.

5. The end use power consumption monitor of claim 4, wherein said power consumption value is integrated by said microprocessor to provide a power consumption rate value.

6. A method of determining a power consumption value for an end use circuit of a commercial or industrial building, comprising the steps of:
   a) feeding a line current through a circuit breaker to an end use circuit disposed in a commercial or industrial building, said circuit breaker being added to reflect a particular end use to which the circuit breaker is servicing;
   b) monitoring said line current within said circuit breaker, and obtaining a voltage signal proportional to said line current being fed to said end use circuit; and
   c) processing said voltage signal to provide a power consumption value for said end use circuit.

7. The method of claim 6, wherein said processing step (c) further comprises the step of integrating said voltage signal to provide a power consumption rate value.

8. The method of claim 6, wherein said steps (a) through (c) are performed for each of a plurality of end use circuits.

9. The method of claim 6, further comprising the steps of:
   d) recording said power consumption value.

10. The method of claim 8, further comprising the steps of:
    d) recording each of said power consumption values.

11. The method of claim 6, further comprising the steps of:
    d) breaking the line current to said end use circuit when said line current exceeds a circuit breaker limit.

12. The method of claim 8, further comprising the steps of:
    d) breaking the line current to any of said end use circuits when its line current exceeds its circuit breaker limit.

13. An end use power consumption monitor system for industrial or commercial buildings integrally constructed with a circuit breaker panel, said power consumption monitor system comprising:
    a plurality of circuit breakers each servicing an end use circuit in an industrial or commercial building, and each being coded to reflect said particular end use to which each circuit breaker is servicing;
    a circuit breaker panel for housing said plurality of circuit breakers; and
    power consumption monitoring means disposed within each of said plurality of circuit breakers housed in said circuit breaker panel for monitoring power consumption of a respective end use circuit of said industrial or commercial building.

14. The end use power consumption monitor system for industrial or commercial buildings in accordance with claim 13, wherein said power consumption monitoring means further comprises means for providing a power consumption value for each end use circuit.

15. The end use power consumption monitor system for industrial or commercial buildings in accordance with claim 14, wherein said power consumption monitoring means further comprises means for recording said power consumption value for each end use circuit.

16. An end use power consumption monitor system for industrial or commercial buildings in accordance with claim 14, wherein said power consumption monitoring means is connected to a recording means by an optical fiber, said recording means recording a power consumption value for each end use circuit.

* * * * *